(12) United States Patent
Baratam et al.

(10) Patent No.: US 10,355,674 B2
(45) Date of Patent: Jul. 16, 2019

(54) CLOCK GATING CIRCUIT

(71) Applicant: ARM Limited, Cambridge (GB)

(72) Inventors: Anil Kumar Baratam, Bangalore (IN); Nruthya Nagesh Prabhu, Bangalore (IN); Yves Thomas Laplanche, Austin, TX (US)

(73) Assignee: ARM Limited, Cambridge (GB)

( * ) Notice: Subject to any disclaimer, the term of this patent is extended or adjusted under 35 U.S.C. 154(b) by 38 days.

(21) Appl. No.: 15/658,214

(22) Filed: Jul. 24, 2017

(65) Prior Publication Data

US 2019/0028091 A1 Jan. 24, 2019

(51) Int. Cl.
*H03K 3/356* (2006.01)
*H03K 17/687* (2006.01)

(52) U.S. Cl.
CPC ... *H03K 3/356121* (2013.01); *H03K 17/6872* (2013.01)

(58) Field of Classification Search
CPC ..... H03K 3/29; H03K 19/002; H03K 19/0005
See application file for complete search history.

(56) References Cited

U.S. PATENT DOCUMENTS

| | | | | |
|---|---|---|---|---|
| 5,270,875 A * | 12/1993 | Shah | ................ | G11B 20/10009 360/46 |
| 6,396,934 B1 * | 5/2002 | Federspiel | ......... | H03H 11/1291 330/282 |
| 7,323,912 B2 * | 1/2008 | Nielsen | ................ | H03K 17/063 326/83 |
| 8,325,865 B1 * | 12/2012 | Rofougaran | ........... | H04B 1/001 375/316 |
| 8,344,810 B2 * | 1/2013 | Lian | ........................ | H03F 3/187 330/305 |
| 9,362,910 B2 | 6/2016 | Gurumurthy et al. | | |
| 10,097,163 B2 * | 10/2018 | Lee | ........................ | H03H 17/025 |
| 2005/0129156 A1 * | 6/2005 | Lourens | ............. | H03H 11/1252 375/350 |
| 2005/0248368 A1 * | 11/2005 | Bertram | ............. | H03K 19/0963 326/98 |
| 2008/0036536 A1 * | 2/2008 | Khorramabadi | .... | H01F 17/0013 330/252 |

(Continued)

OTHER PUBLICATIONS

Three-State Logic; Wikipedia; Mar. 31, 2017. https://en.wikipedia.org/w/index.php?title=Three-state_logic&oldid=154648144.

(Continued)

*Primary Examiner* — Adam D Houston
(74) *Attorney, Agent, or Firm* — Pramudji Law Group PLLC; Ari Pramudji

(57) ABSTRACT

Various implementations described herein are directed to an integrated circuit. The integrated circuit may include a first stage that receives an enable signal and an input clock signal and provides a first intermediate signal based on the enable signal and the input clock signal. The integrated circuit may include a second stage that receives the first intermediate signal and the input clock signal and provides a second intermediate signal based on a ternary logic response to the first intermediate signal and the input clock signal. The integrated circuit may include a third stage that receives the second intermediate signal and the input clock signal and provides an output clock signal based on the second intermediate signal and the input clock signal.

23 Claims, 14 Drawing Sheets

(56) References Cited

U.S. PATENT DOCUMENTS

| | | | | |
|---|---|---|---|---|
| 2008/0100374 A1* | 5/2008 | Papananos | ......... | H03H 11/1291 327/553 |
| 2010/0097152 A1* | 4/2010 | Wang | ................ | H03H 11/1291 331/44 |
| 2010/0156575 A1* | 6/2010 | Shah | ......................... | H03J 3/08 334/78 |
| 2010/0244943 A1* | 9/2010 | Hahn | ................ | H03H 11/1291 327/553 |
| 2010/0244945 A1* | 9/2010 | Hahn | ................... | H03H 7/0153 327/553 |
| 2011/0221480 A1* | 9/2011 | Ikeda | .............. | H03K 17/04123 327/109 |
| 2011/0254644 A1* | 10/2011 | Nutt | ................... | H03K 19/0008 334/39 |
| 2012/0014156 A1* | 1/2012 | Park | ..................... | G11C 7/1078 365/51 |
| 2012/0062190 A1* | 3/2012 | Haiplik | ................ | H02M 3/156 323/271 |
| 2012/0130651 A1* | 5/2012 | Papadimitriou | ... | G01N 27/9046 702/35 |
| 2012/0133420 A1* | 5/2012 | Draxelmayr | ......... | H02M 3/337 327/430 |
| 2012/0146539 A1* | 6/2012 | Riesebosch | ......... | H05B 33/089 315/291 |
| 2012/0256674 A1* | 10/2012 | Foroudi | .............. | H03H 11/245 327/308 |
| 2012/0293248 A1* | 11/2012 | Chen | ................. | H03H 11/1213 327/553 |
| 2013/0040592 A1* | 2/2013 | Lee | .................... | H03H 11/1291 455/226.1 |
| 2013/0109334 A1* | 5/2013 | Kwon | ................. | H04B 1/0475 455/114.3 |
| 2013/0154738 A1* | 6/2013 | Lee | ....................... | H03G 3/002 330/254 |
| 2013/0169320 A1* | 7/2013 | van Dijk | ............. | H03K 17/145 327/109 |
| 2013/0225101 A1* | 8/2013 | Basaran | ................... | H03H 7/12 455/79 |
| 2013/0265029 A1* | 10/2013 | Akiyama | ............... | H03K 17/94 323/311 |
| 2013/0278341 A1* | 10/2013 | Tsou | ....................... | H03F 3/193 330/271 |
| 2014/0002145 A1* | 1/2014 | Mauder | .................. | H03K 17/06 327/109 |
| 2014/0065992 A1* | 3/2014 | Lee | .................... | H03H 11/1291 455/139 |
| 2014/0103962 A1* | 4/2014 | Ajram | .................. | H03K 17/082 327/108 |
| 2014/0333373 A1* | 11/2014 | Pamarti | .................. | H03H 19/00 327/553 |
| 2015/0035622 A1* | 2/2015 | Maxim | ................... | H03F 1/565 333/202 |
| 2015/0094008 A1* | 4/2015 | Maxim | ............... | H01F 17/0013 455/245.1 |
| 2015/0236663 A1* | 8/2015 | Buer | ........................ | H03F 3/19 455/20 |
| 2015/0236748 A1* | 8/2015 | Nobbe | ................... | H04B 17/12 455/78 |
| 2015/0381129 A1* | 12/2015 | Brekelmans | ............. | H03G 3/18 330/254 |
| 2016/0254810 A1* | 9/2016 | Rossberg | ......... | H03K 17/04206 327/109 |
| 2016/0352235 A1* | 12/2016 | Imai | ................... | H02M 3/33569 |
| 2016/0365859 A1* | 12/2016 | Song | ............. | H03K 19/018514 |
| 2017/0033759 A1* | 2/2017 | Saigusa | ................... | H04B 1/10 |
| 2017/0149411 A1* | 5/2017 | Nielsen | ................. | H03G 3/3042 |
| 2017/0302243 A1* | 10/2017 | Horita | ....................... | H01P 1/20 |
| 2018/0115237 A1* | 4/2018 | Morin | ................... | H02M 3/156 |
| 2018/0294732 A1* | 10/2018 | Ye | ..................... | H02M 3/33546 |

OTHER PUBLICATIONS

Tristate Logic (definition); McGraw-Hill Dictionary of Scientific and Technical Terms, Sixth Edition; 2003.

* cited by examiner

Example of Phase Operational Diagram of Clock Gating Circuitry 300E of Figure 3E

| Phases | 1 | 2 | 3 | 4 | 5 | 6 | 7 | 8 | 9 |
|---|---|---|---|---|---|---|---|---|---|
| Node Values | | | | | | | | | |
| E/SE | 0 | 0 | 1 | 1 | 1 | 1 | 1 | 0 | 0 |
| CK | 0 | 1 | 1 | 0 | 1 | 0 | 1 | 1 | 0 |
| NE | 1 | Z | 0 | 0 | 0 | 1 | 0 | 0 | 1 |
| M | 0 | 0 | 0 | 1 | 0 | 1 | 0 | 1 | 0 |
| NM | 1 | 1 | 1 | 0 | 1 | 0 | 1 | 0 | 1 |
| NCK | 1 | 1 | 0 | 1 | 0 | 1 | 0 | 0 | 1 |
| ECK | 0 | 0 | 0 | 0 | 1 | 0 | 1 | 1 | 0 |
| Transistor States | | | | | | | | | |
| M0 | OFF | OFF | ON | ON | ON | ON | ON | OFF | OFF |
| M1 | OFF | OFF | ON | ON | ON | ON | ON | OFF | OFF |
| N2 | OFF | OFF | OFF | ON | OFF | ON | OFF | ON | OFF |
| P2 | ON | OFF | OFF | OFF | OFF | OFF | OFF | OFF | ON |
| P1 | ON | ON | OFF | OFF | OFF | OFF | OFF | ON | ON |
| P0 | ON | ON | OFF | OFF | OFF | OFF | OFF | ON | ON |
| N3 | ON | X | OFF | ON | ON | ON | ON | OFF | ON |
| M4 | OFF | X | OFF | OFF | OFF | OFF | OFF | OFF | OFF |
| P3 | OFF | ON | ON | OFF | ON | OFF | ON | ON | OFF |
| N5 | ON | ON | ON | OFF | OFF | OFF | OFF | OFF | ON |
| M6 | OFF | OFF | OFF | OFF | ON | OFF | ON | ON | OFF |
| P7 | OFF | OFF | OFF | OFF | ON | OFF | ON | ON | OFF |

CLOCK GATING CIRCUIT

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In modern circuit designs, memory circuits and related mechanisms save power by inhibiting flip-flops from switching logic states when inactive. With clock gating circuits, non-contributing flip-flops may be selectively inactivated. However, conventional clock gating circuits use tri-state inverters to provide three-state or tri-state logic functions that allow for an output port to assume a high impedance state in addition to a low logic level (logic 0 state) and a high logic level (logic 1 state) to thereby effectively remove the output from the circuitry. This allows multiple circuits to share a same output line. Unfortunately, a disadvantage is that tri-state inverter implementations typically use 4 transistors for each tri-state inverter, which causes an area penalty in the circuitry.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

FIG. 4 illustrates a phase diagram of clock gating circuitry in accordance with implementations described herein.

DETAILED DESCRIPTION

Various implementations described herein refer to schemes and techniques for implementing clock gating circuitry. For instance, some implementations described herein provide schemes and techniques associated with integrated clock gating (ICG) circuitry for interrupting the input clock using a ternary logic function to save power. The ICG circuitry may be adapted for use in various memory applications, such as, e.g., for use in flip-flop (FF) logic applications. Some examples described herein may refer to pre-ICG (PREICG) applications when the input clock is active high or active positive, and other examples described herein may refer to pre-ICG-neg (PREICGN) applications when the input clock is active low or active negative.

Accordingly, various implementations for providing clock gating circuitry will now be described with reference to FIGS. 1-7.

Figure 1:
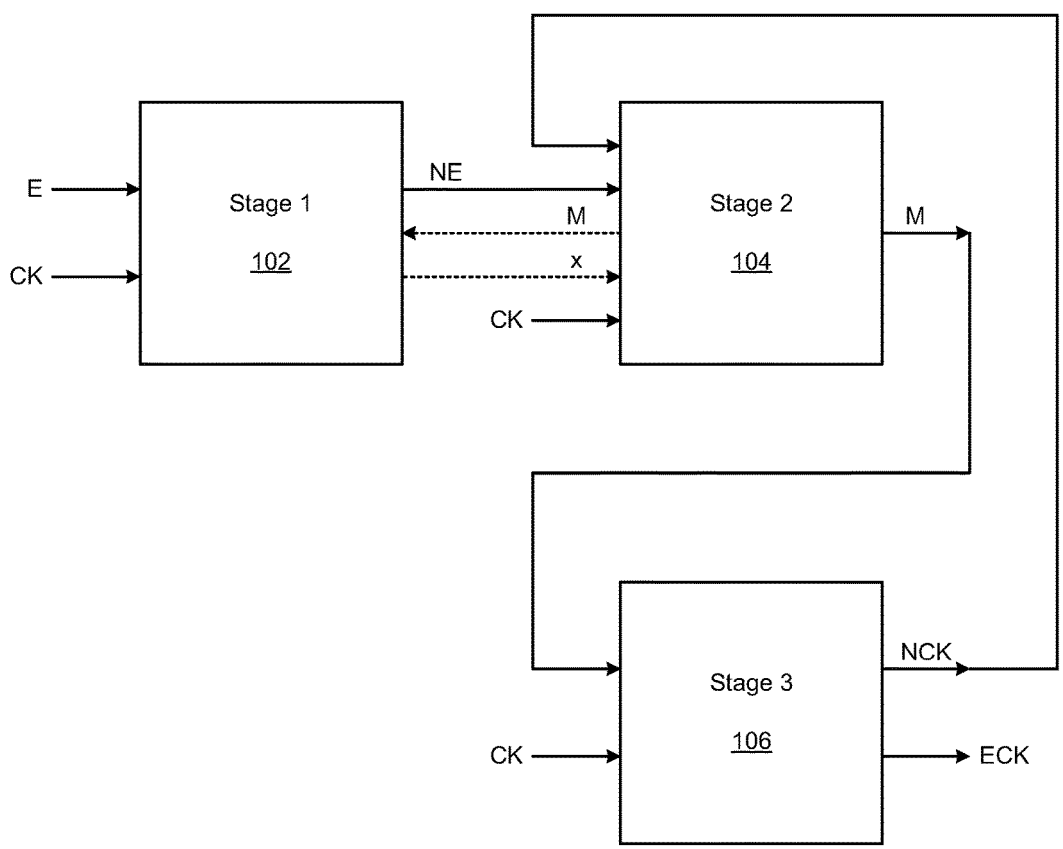
FIG. 1 illustrates a block diagram of clock gating circuitry in accordance with implementations described herein.

FIG. 1 illustrates a block diagram of clock gating circuitry 100 in accordance with implementations described herein. As shown in FIG. 1, the clock gating circuitry 100 may include multiple stages including, e.g., a first stage 102, a second stage 104, and a third stage 106. The clock gating circuitry 100 may include other stages. As shown in FIG. 1, the input clock signal CK is separately provided to each of the multiple stages, including the first stage 102, the second stage 104, and the third stage 106. FIG. 1 along with supporting FIGS. 2-5C refer to a PREICG type structure, wherein the input clock circuitry is active high or active positive.

The first stage 102 may receive an enable signal E and an input clock signal CK, and the first stage 102 may provide a first intermediate signal NE based on the enable signal E and the input clock signal CK. The first stage 102 may be implemented with a logic function circuit (e.g., NOR gate structure) that provides the first intermediate signal NE based on the enable signal E and the input clock signal CK. As shown in FIG. 1, the input clock signal CK is provided to the first stage 102. In some implementations, the enable signal E may be used along with a scan enable signal SE to allow a scan function, wherein a node for the scan enable signal SE (which may be an equivalent to the enable signal E) may be added for the scan function. For instance, FIGS. 3A-3F show use of the enable signal E along with the scan enable signal SE.

The second stage 104 may receive the first intermediate signal NE and the input clock signal CK, and the second stage 104 may provide a second intermediate signal M based on a ternary logic response to the first intermediate signal NE and the input clock signal CK. The second stage 104 may be implemented with a latching function circuit for holding a data value through use of the ternary logic response to the first intermediate signal NE and the input clock signal CK. The latching function circuit may have a ternary logic structure that provides the ternary logic response to the first intermediate signal NE and the input clock signal CK. The ternary logic structure of the second stage 104 may include multiple transistors (e.g., less than four transistors) that are arranged to receive the first intermediate signal NE and the input clock signal CK and provide the second intermediate signal M based on the ternary logic response to the first intermediate signal NE and the input clock signal CK. As shown in FIG. 1, the input clock signal CK is provided to the second stage 104. As described herein, the multiple transistors (e.g., less than four transistors) of the ternary logic structure of the second stage 104 may include use of complementary metal-oxide-semiconductor (CMOS) transistors, e.g., two P-type MOS (PMOS) transistors and one N-type MOS (NMOS) transistor.

In some implementations, as described herein below, the second stage 104 may be adapted to provide and/or receive one or more optional signals. For instance, the second intermediate signal M may be provided as an optional feedback signal from the second stage 104 to the first stage 102. In another instance, an optional feed-forward signal x may be received by the second stage 104 from the first stage 102. Thus, as described herein below, these optional signals (e.g., feedback M and feed-forward x) may be provided based on various alternative circuit configurations and/or arrangements. For instance, the optional feedback signal M is described in reference to FIG. 3D, and the optional feed-forward signal x is described in reference to FIG. 3F.

The third stage 106 may receive the second intermediate signal M and the input clock signal CK, and the third stage 106 may provide an output clock signal ECK based on the second intermediate signal M and the input clock signal CK. The third stage 106 may include another logic function circuit (e.g., NAND gate structure) and an inverter gate structure that are arranged to provide the output clock signal ECK based on the second intermediate signal M and the input clock signal CK. In some scenarios, the third stage 106 may be implemented as an integrated clock gating (ICG) circuit that interrupts the input clock signal CK to a logical off state (i.e., logical 0 or 0V) in response to the second intermediate signal M and the input clock signal CK. As shown in FIG. 1, the input clock signal CK is provided to the third stage 106.

In some scenarios, the third stage 106 may provide a feedback signal NCK to the second stage 104, and in this case, the second stage 104 may receive the feedback signal NCK and then provide the second intermediate signal M based on the ternary logic response to the first intermediate signal NE, the input clock signal CK, and the feedback signal NCK. The feedback signal NCK may be referred to as an inverted clock signal. As described herein, the third stage 106 may be implemented with another logic function circuit (e.g., NAND gate structure) that receives the second intermediate signal M and the input clock signal CK and then provides the feedback signal NCK based on the second intermediate signal M and the input clock signal CK. The third stage 106 may also include another inverter gate structure coupled to the NAND gate structure, and the inverter gate structure may receive the feedback signal NCK from the NAND gate structure and may then provide the output clock signal ECK based on the feedback signal NCK.

The clock gating circuitry 100 may be implemented as an integrated circuit (IC) when used in various types of memory applications, such as, e.g., a scan cell for random access memory (RAM), and/or any other types of memory, including any type of volatile and non-volatile memory. The clock gating circuitry 100 may be implemented as an IC in any single or dual rail type memory architecture, such as, e.g., single or dual port memory architecture. The circuitry 100 may be integrated with various computing circuitry and/or various components on a single chip. Further, the circuitry 100 may be implemented in an embedded system for various electronic and mobile applications.

Figure 2:
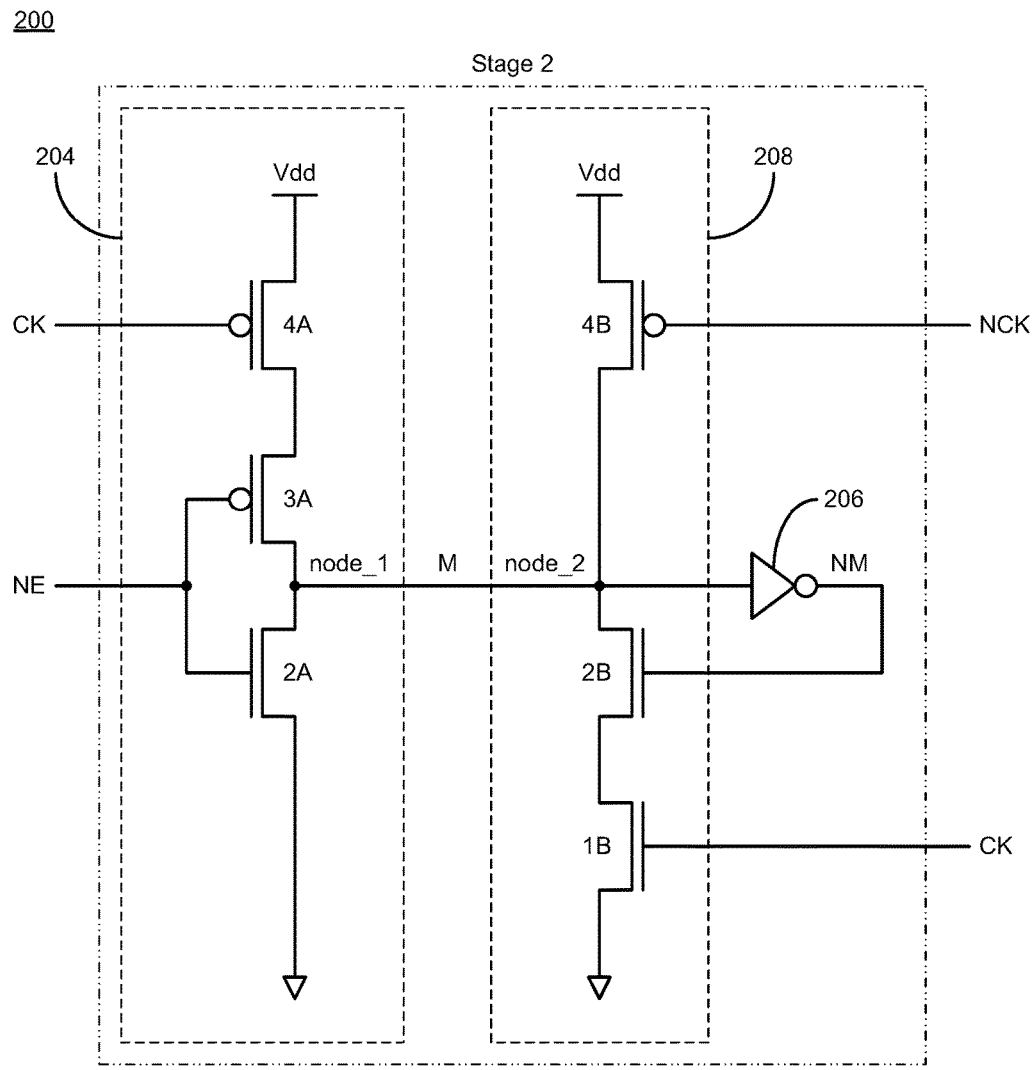
FIG. 2 illustrates a schematic diagram of clock gating circuitry that provides a ternary logic response in accordance with implementations described herein.

FIG. 2 illustrates a diagram of clock gating circuitry 200 that provides a ternary logic response in accordance with implementations described herein. In some instances, the clock gating circuitry 200 of FIG. 2 may be an implementation of the second stage 104 in FIG. 1. As shown in FIG. 2, the clock gating circuitry 200 may include a first logic circuit 204, a second logic circuit 208, and an inverter 206. This configuration and/or arrangement is further described in reference to an implementation of FIG. 3B.

The first logic circuit 204 may receive the first intermediate signal NE and the input clock signal CK, and the first logic circuit 204 may provide the second intermediate signal M at node_1 based on a ternary logic response to the first intermediate signal NE and the input clock signal CK. The first logic circuit 204 may include multiple transistors disposed between a source voltage Vdd and ground Gnd. The multiple transistors (e.g., less than four transistors) may be arranged to receive the first intermediate signal NE and the input clock signal CK and then provide the second intermediate signal M based on the ternary logic response (or three-valued logic response) to the first intermediate signal NE and the input clock signal CK. The multiple transistors (e.g., less than four transistors) of the ternary logic structure may include multiple CMOS transistors including one NMOS transistor 2A and two PMOS transistors 3A, 4A. In some scenarios, as shown in FIG. 2, the NMOS transistor 2A may receive the first intermediate signal NE, the first PMOS transistor 3A may receive the first intermediate signal NE, and a second PMOS transistor 4A may receive the clock signal CK. Further, CMOS implementation of ternary logic may include use of 2 PMOS transistors and 1 NMOS transistor; however, 1 PMOS transistor and 2 NMOS transistors may be used (e.g., 308B in FIG. 2B).

The inverter 206 may receive the second intermediate signal M from node_1 or from node_2 (which is the same as node_1), and the inverter 206 may invert the second intermediate signal M and then provide the inverted second intermediate signal NM back to the second logic circuit 208. As shown, the nodes node_1, node_2 may be at a same potential, such as e.g., the second intermediate signal M.

The second logic circuit 208 may receive the feedback signal NCK (i.e., inverted clock signal), the inverted second intermediate signal NM, and the input clock signal CK, and the second logic circuit 208 may provide the second intermediate signal M based on a ternary logic response (or 3-valued logic response) to the received signals NCK, NM, and CK. The second logic circuit 208 may include multiple transistors disposed between the source voltage Vdd and ground Gnd. The multiple transistors (e.g., less than four transistors) may be arranged to receive the feedback signal NCK, the inverted second intermediate signal NM, and the input clock signal CK and then provide the second intermediate signal M based on the ternary logic response (or 3-valued logic response) to the received signals NCK, NM, and CK. The multiple transistors (e.g., less than four transistors) of the ternary logic structure may include multiple CMOS transistors including two NMOS transistors 1B, 2B and one PMOS transistor 4B. In some scenarios, as shown in FIG. 2, the first NMOS transistor 1B may receive the clock signal CK, the second NMOS transistor 2B may receive the inverted second intermediate signal NM, and the PMOS transistor 4B may receive the feedback signal NCK (i.e., inverted clock signal).

In reference to FIG. 2, Table 1 herein below is a representation of the ternary logic response of the first logic circuit 204 of the clock gating circuitry 200.

TABLE 1

| CK | NCK | (in) NE | (out) M | |
|----|-----|---------|---------|---|
| 0 | NA | 1 | 0 | M is inverted NE |
| 0 | NA | 0 | 1 | M is inverted NE |
| 1 | NA | 1 | 0 | M is not blocked for NE = 1 (Ternary) |
| 1 | NA | 0 | Z | High Z |

In reference to FIG. 2, Table 2 herein below is a representation of the ternary logic response of the second logic circuit 208 of the clock gating circuitry 200.

TABLE 2

| CK | NCK | (in) NM | (out) M | |
|----|-----|---------|---------|---|
| 1 | 0 | 1 | * | Mid-Value = DC Path (Ternary) |
| 1 | 0 | 0 | 1 | Due to PFET/NCK |

TABLE 2-continued

| CK | NCK | (in) NM | (out) M | |
|---|---|---|---|---|
| 0 | 1 | 1 | Z | Output is High Z |
| 0 | 1 | 0 | Z | Output is High Z |

In some implementations, the clock gating circuitry 200 of FIG. 2 may operate and/or function as a latch. As described herein above, the first and second logic circuits 204, 208 are utilized as ternary logic structures and circuits. The comparison of Tables 1, 2 as truth tables is shown herein above. Structurally, each transistor stack in circuits 204, 208 utilize three transistors, which is less than four transistors. As such, each circuit 204, 208 may thus occupy less area. As shown in Table 1 for the first logic circuit 204, when CK=1 and input NE=1, then output M is driven low, or zero output. As shown in Table 2 for the second logic circuit 208, when CK=1 and NCK=0, then the transistors 1B and 2B are turned ON. In this instance, input NM is 1, and output M is driven to a mid-value (i.e., mid-rail value) because the transistors 1B, 2B in the path is ON. The first and second circuits 204, 208 operate and/or function as ternary logic structures and/or circuits to thereby provide a ternary logic response (or 3 valued logic response).

In some implementations, the clock gating circuitry 200 of FIG. 2 provides a combination of circuits 204, 208 along with inverter 206, which may perform the ternary logic response with less area and power. In this instance, the clock gating circuitry 200 takes advantage of the inter-relationship of signals NE and M, which are a function of the enable signal E and the clock signal CK in the first stage 102 of FIG. 1. Further, the feedback signal NCK is not a direct inversion of CK; however, the value of NCK may be determined by M and CK through the gate function in the third stage 106. As described herein below, the operation and/or function of the clock gating circuitry 200 is further demonstrated in reference to various implementations of FIGS. 3A-3F, and in particular FIG. 3B.

FIGS. 3A-3F illustrate various schematic diagrams of clock gating circuitry in accordance with implementations described herein.

Figure 3A:
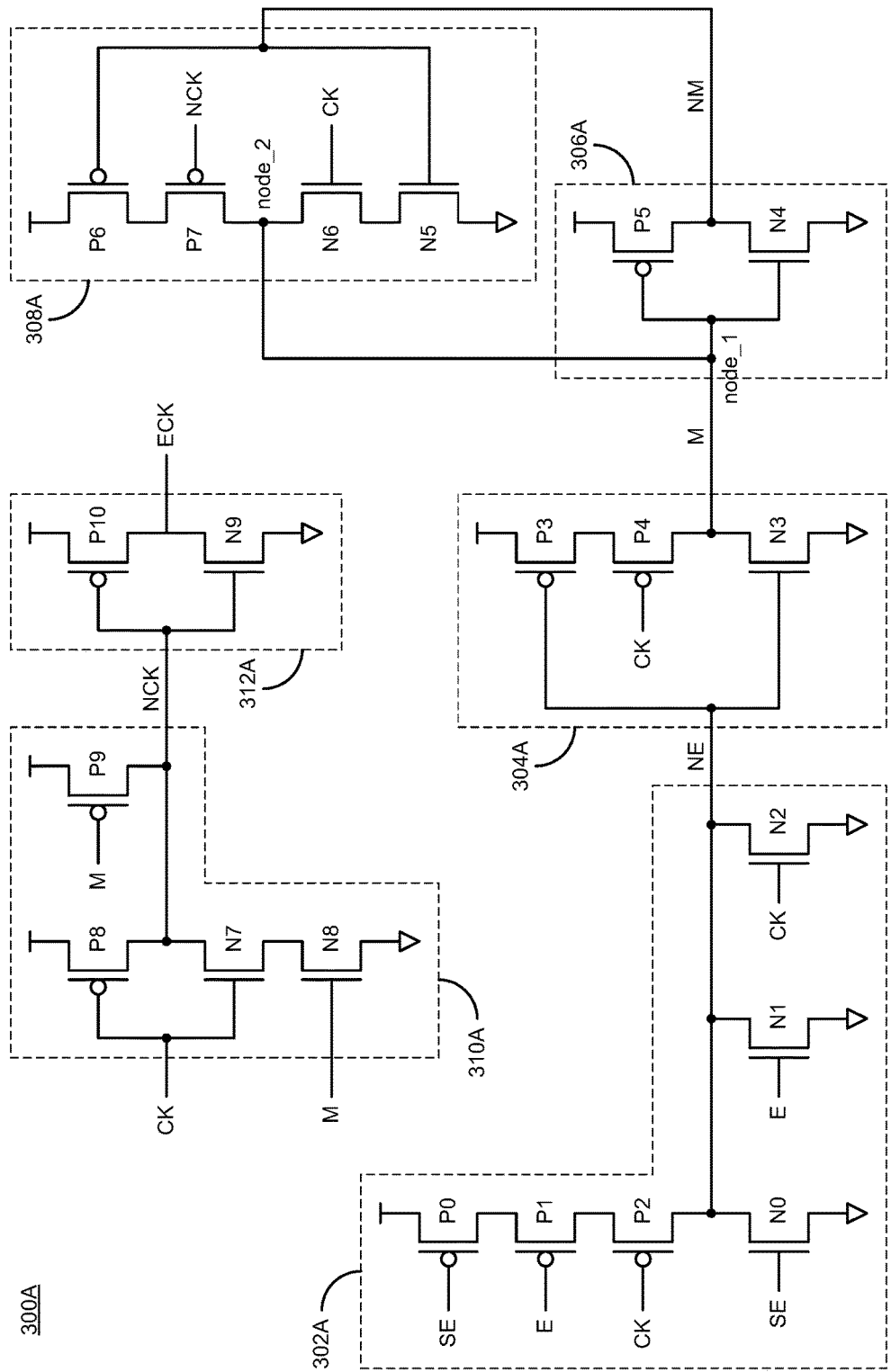
FIGS. 3A-3F illustrate various schematic diagrams of clock gating circuitry in accordance with implementations described herein.

In particular, FIG. 3A illustrates a schematic diagram of one embodiment of clock gating circuitry 300A. The multiple stages of FIG. 1, such as the first stage 102, the second stage 104, and third stage 106, are represented in FIG. 3A.

For instance, the first stage 102 of FIG. 1 is represented with the first stage circuit 302A, which includes multiple transistors arranged as a multi-input (e.g., 3-input) NOR gate structure. The multiple transistors of the first stage circuit 302A include three PMOS transistors P0, P1, P2 and three NMOS transistors N0, N1, N2. As shown, PMOS transistor P0 receives a scan enable signal SE, PMOS transistor P1 receives the enable signal E, and PMOS transistor P2 receives the clock signal CK. Further, as shown, NMOS transistor N0 receives the scan enable signal SE, NMOS transistor N1 receives the enable signal E, and NMOS transistor N2 receives the clock signal CK. These transistors P0, P1, P2, N0, N1, N2 are disposed between the voltage source Vdd and ground Gnd, and during operation, these transistors P0, P1, P2, N0, N1, N2 are arranged to receive the input signals SE, E, CK, respectively, and provide the first intermediate signal NE based on the input signals SE, E, CK, respectively.

Further, in this instance, the second stage 104 of FIG. 1 is represented with the second stage circuits 304A, 306A, 308A. Second stage circuit 304A includes multiple transistors arranged as a ternary logic structure. Second stage circuit 306A includes multiple transistors arranged as an inverter structure. Second stage circuit 308A includes multiple transistors arranged as a tri-state logic structure.

The multiple transistors of the second stage circuit 304A include two PMOS transistors P3, P4 and one NMOS transistor N3. As shown, PMOS transistor P3 receives the first intermediate signal NE, PMOS transistor P4 receives the clock signal CK, and NMOS transistor N3 receives the first intermediate signal NE. These transistors P3, P4, N3 are disposed between the voltage source Vdd and ground Gnd, and during operation, these transistors P3, P4, N3 are arranged to receive the signals NE, CK, respectively, and provide the second intermediate signal M based on the signals NE, CK, respectively. In various embodiments, ternary logic may be implemented with 2 PMOS transistors and 1 NMOS transistor (e.g., as shown in circuit 304A) or with 1 PMOS transistor and 2 NMOS transistors (e.g., as shown in circuit 308B of FIG. 3B).

The multiple transistors of the second stage circuit 306A are arranged as an inverter and include one PMOS transistor P5 and one NMOS transistor N4. As shown, PMOS transistor P5 receives the second intermediate signal M and NMOS transistor N4 also receives the second intermediate signal M. These transistors P5, N4 are disposed between the voltage source Vdd and ground Gnd, and during operation, these transistors P5, N4 are arranged to receive the signal M, respectively, and provide the inverted second intermediate signal NM based on the signal M, respectively.

The multiple transistors of the second stage circuit 308A include two PMOS transistors P6, P7 and two NMOS transistors N5, N6. As shown, PMOS transistor P6 receives the inverted second intermediate signal NM, PMOS transistor P7 receives the feedback signal NCK (inverted clock signal), NMOS transistor N5 receives the inverted second intermediate signal NM, and NMOS transistor N6 receives the clock signal CK. These transistors P6, P7, N5, N6 are disposed between the voltage source Vdd and ground Gnd, and during operation, these transistors P6, P7, N5, N6 are arranged to receive the signals NM, NCK, CK, respectively, and provide the second intermediate signal M based on the signals NM, NCK, CK, respectively, at node_2.

Further, in this instance, the third stage 106 of FIG. 1 is represented with the third stage circuits 310A, 312A. Third stage circuit 310A includes multiple transistors arranged as a NAND gate structure. Third stage circuit 312A includes multiple transistors arranged as an inverter structure.

The multiple transistors of the third stage circuit 310A include two PMOS transistors P8, P9 and two NMOS transistors N7, N8. As shown, PMOS transistor P8 receives the clock signal CK, PMOS transistor P9 receives the second intermediate signal M, NMOS transistor N7 receives the clock signal CK, and NMOS transistor N8 receives the second intermediate signal M. These transistors P8, P9, N7, N8 are disposed between the voltage source Vdd and ground Gnd, and during operation, these transistors P8, P9, N7, N8 are arranged to receive the signals M, CK, respectively, and provide the feedback signal NCK (inverted clock signal) based on the signals M, CK, respectively.

The multiple transistors of the third stage circuit 312A are arranged as an inverter and include one PMOS transistor P10 and one NMOS transistor N9. As shown, PMOS transistor P10 receives the feedback signal NCK (inverted clock signal) and NMOS transistor N9 receives the feedback signal NCK (inverted clock signal). These transistors P10, N9 are disposed between the voltage source Vdd and ground Gnd, and during operation, these transistors P10, N9 are arranged to receive the signal NCK, respectively, and provide the output signal ECK based on the signal NCK, respectively.

Figure 3B:
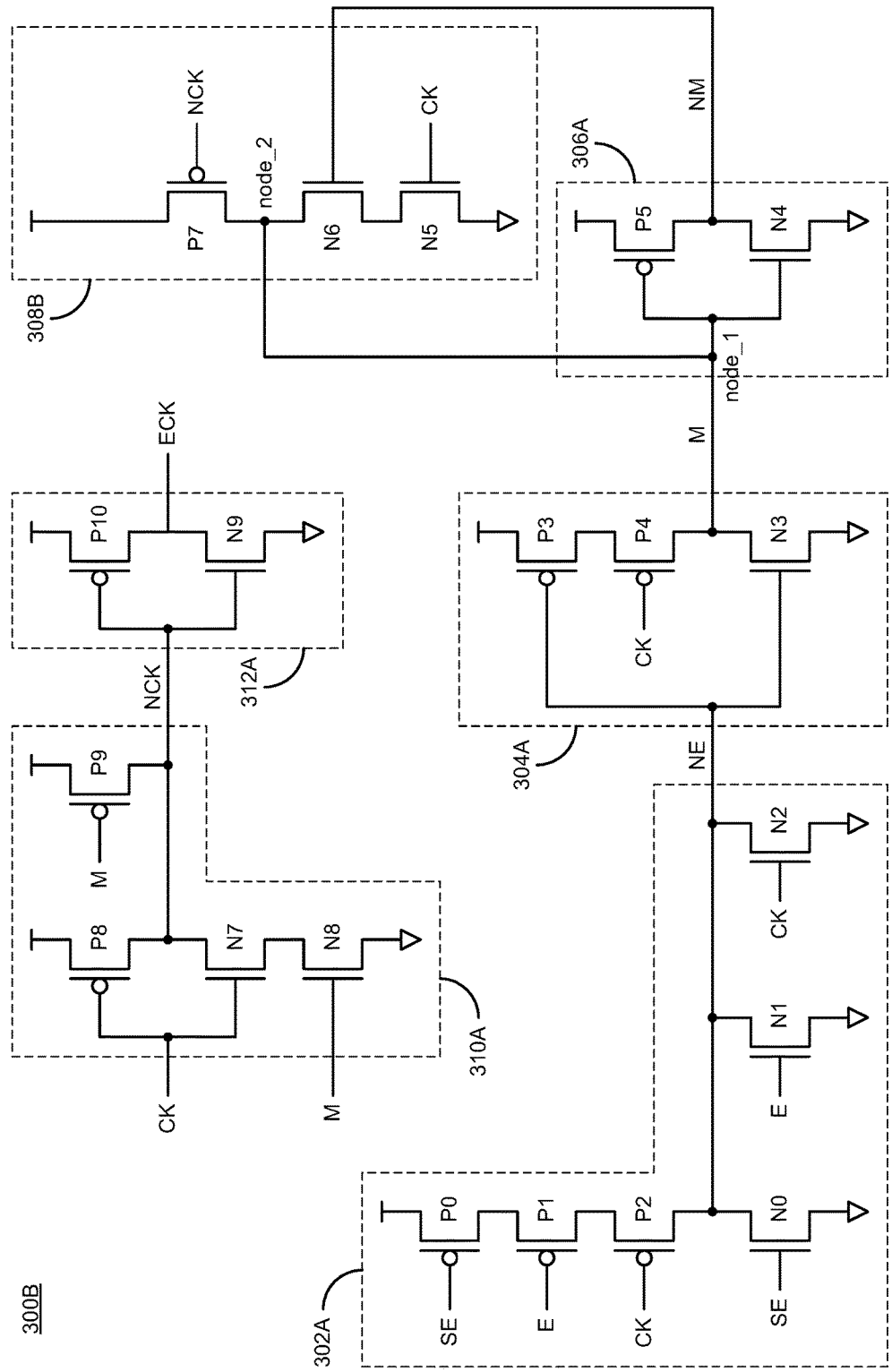

FIG. 3B illustrates a schematic diagram of one embodiment of clock gating circuitry 300B. The multiple stages of FIG. 1, such as the first stage 102, the second stage 104, and third stage 106, are represented in FIG. 3B.

The clock gating circuitry 300B of FIG. 3B includes circuits 302A, 304A, 306A, 310A, and 312A of FIG. 3A, which operate and/or function similarly as described herein above in reference to FIG. 3A. As shown, second stage circuit 308B of FIG. 3B is different than the second stage circuit 308A of FIG. 3A.

The multiple transistors of the second stage circuit 308B includes one PMOS transistor P7 and two NMOS transistors N5, N6. As shown, PMOS transistor P7 receives the feedback signal NCK (inverted clock signal), NMOS transistor N5 receives the clock signal CK, and NMOS transistor N6 receives the inverted second intermediate signal NM. These transistors P7, N5, N6 are disposed between the voltage source Vdd and ground Gnd, and during operation, these transistors P7, N5, N6 are arranged to receive the signals NCK, NM, CK, respectively, and provide the second intermediate signal M based on the signals NCK, NM, CK, respectively, at node_2.

Figure 3C:
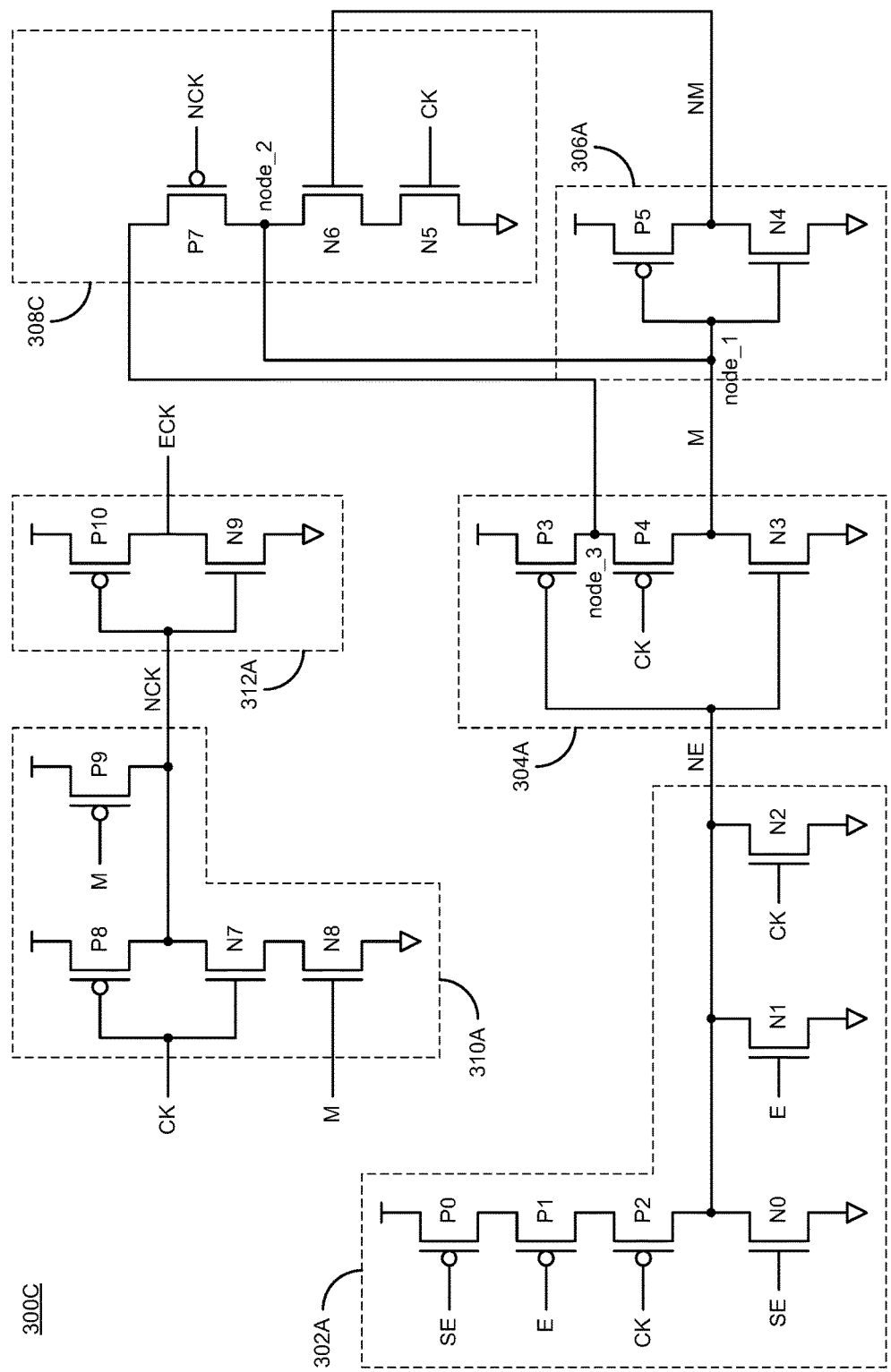

FIG. 3C illustrates a schematic diagram of one embodiment of clock gating circuitry 300C. The multiple stages of FIG. 1, such as the first stage 102, the second stage 104, and third stage 106, are represented in FIG. 3C.

The clock gating circuitry 300C of FIG. 3C includes circuits 302A, 304A, 306A, 310A, and 312A of FIG. 3A, which operate and/or function similarly as described herein above in reference to FIG. 3A. As shown, second stage circuit 308C of FIG. 3C is similar to the second stage circuit 308B of FIG. 3B. However, the second stage circuit 308C of FIG. 3C is different than the second stage circuit 308B of FIG. 3B in that PMOS transistor P7 is coupled between node_3 of the second stage circuit 304A and node_2 of the second stage circuit 308C. As shown, node_3 is disposed between PMOS transistors P3, P4 of the second stage circuit 304A.

Figure 3D:
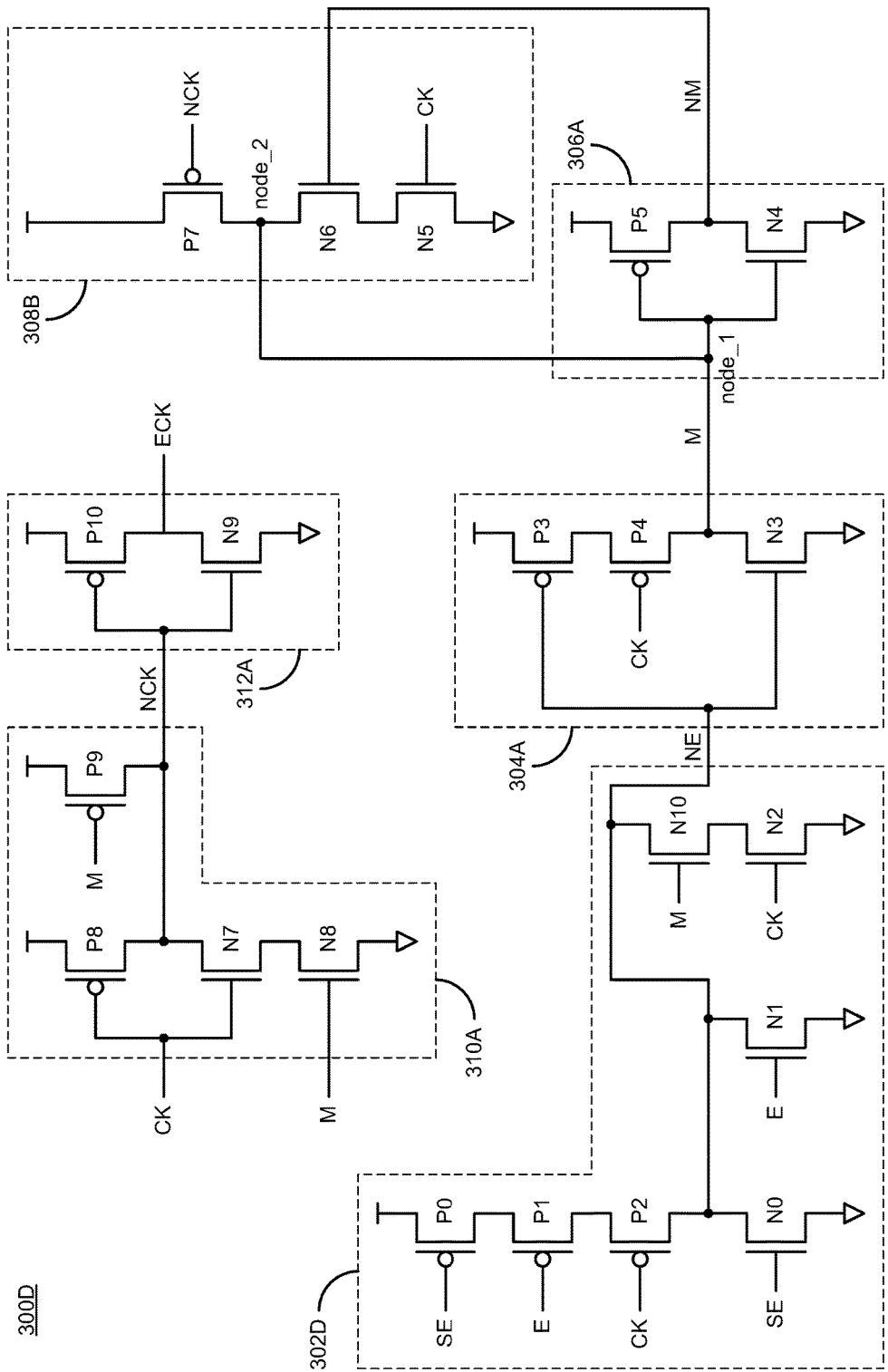

FIG. 3D illustrates a schematic diagram of one embodiment of clock gating circuitry 300D. The multiple stages of FIG. 1, such as the first stage 102, the second stage 104, and third stage 106, are represented in FIG. 3D.

The clock gating circuitry 300D of FIG. 3D includes circuits 304A, 306A, 310A, and 312A of FIG. 3A, which operate and/or function similarly as described herein above in reference to FIG. 3A. The clock gating circuitry 300D of FIG. 3D includes circuit 308B of FIG. 3B, which operates and/or functions similarly as described herein above in reference to FIG. 3B. As shown, first stage circuit 302D of FIG. 3D is similar to the first stage circuit 302A of FIG. 3A. However, the first stage circuit 302D of FIG. 3D is different than the first stage circuit 302A of FIG. 3A in that NMOS transistor N10 is coupled between the signal path of the first intermediate signal NE and NMOS transistor N2. As shown in FIG. 3D, NMOS transistor N10 receives the second intermediate signal M as an optional feedback signal from the second stage circuit 304A.

Figure 3E:
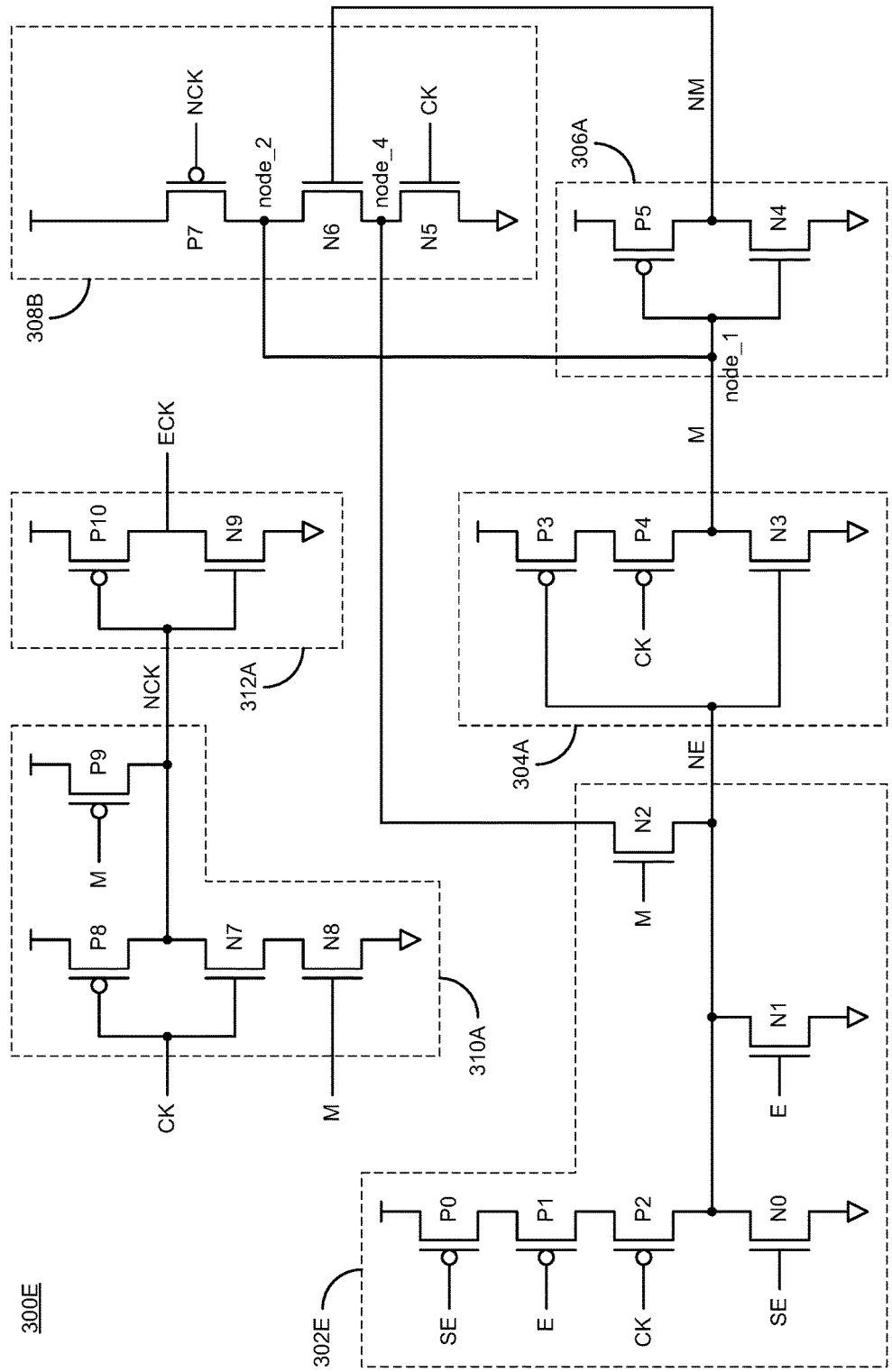

FIG. 3E illustrates a schematic diagram of one embodiment of clock gating circuitry 300E. The multiple stages of FIG. 1, such as the first stage 102, the second stage 104, and third stage 106, are represented in FIG. 3E.

The clock gating circuitry 300E of FIG. 3E includes circuits 304A, 306A, 310A, and 312A of FIG. 3A, which operate and/or function similarly as described herein above in reference to FIG. 3A. The clock gating circuitry 300E of FIG. 3E includes circuit 308B of FIG. 3B, which operates and/or functions similarly as described herein above in reference to FIG. 3B. As shown, first stage circuit 302E of FIG. 3E is similar to the first stage circuit 302A of FIG. 3A. However, the first stage circuit 302E of FIG. 3E is different than the first stage circuit 302A of FIG. 3A in that NMOS transistor N2 is coupled between the signal path of the first intermediate signal NE and node_4 of second stage circuit 308B. Also, node_4 is disposed between NMOS transistors N5, N6 of the second stage circuit 308B. Further, as shown in FIG. 3E, NMOS transistor N2 receives the second intermediate signal M.

Figure 3F:
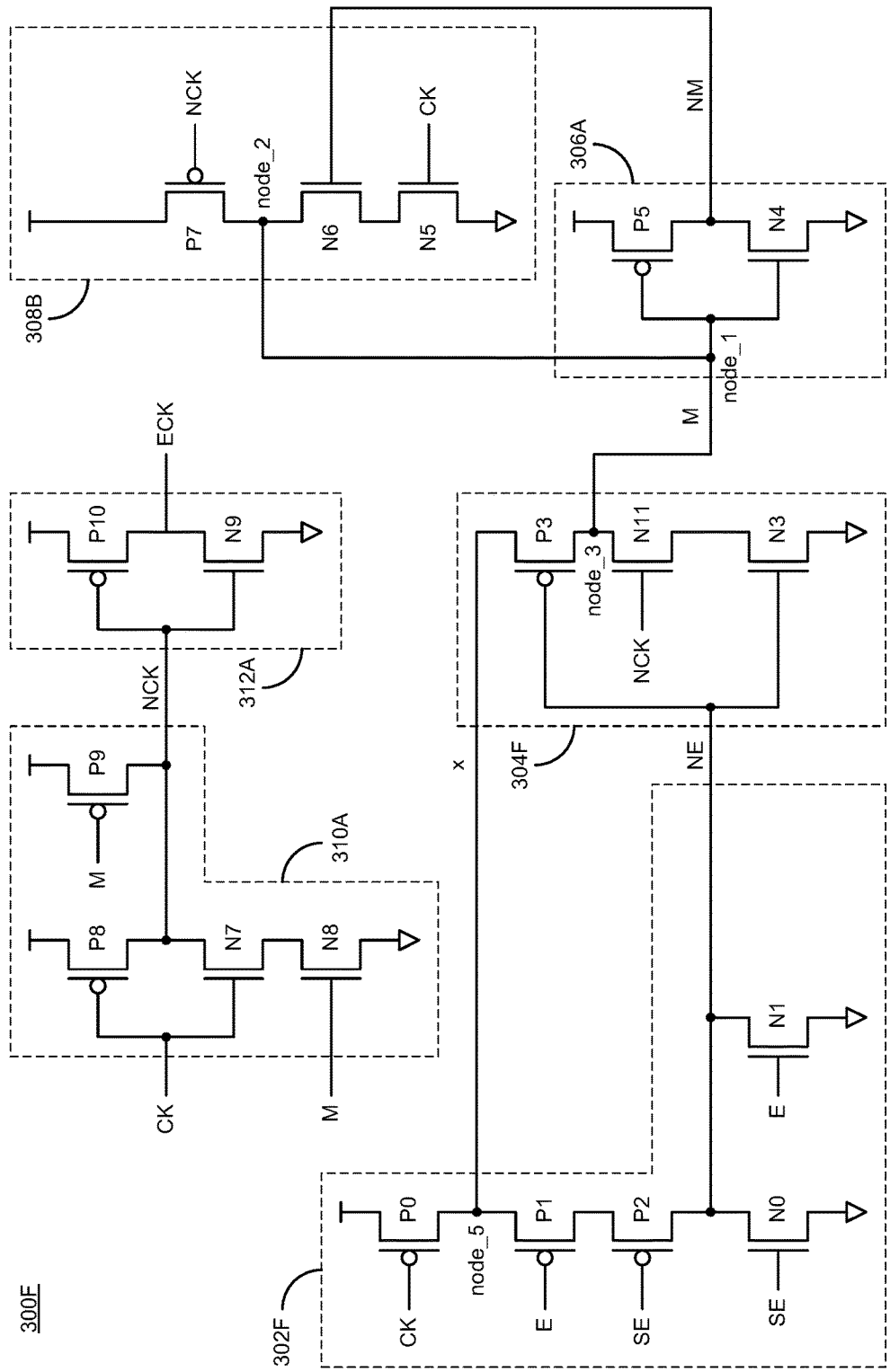

FIG. 3F illustrates a schematic diagram of one embodiment of clock gating circuitry 300F. The multiple stages of FIG. 1, such as the first stage 102, the second stage 104, and third stage 106, are represented in FIG. 3F.

The clock gating circuitry 300F of FIG. 3F includes circuits 306A, 310A, and 312A of FIG. 3A, which operate and/or function similarly as described herein above in reference to FIG. 3A. The clock gating circuitry 300F of FIG. 3F includes circuit 308B of FIG. 3B, which operates and/or functions similarly as described herein above in reference to FIG. 3B. As shown, first stage circuit 302F of FIG. 3F is similar to the first stage circuit 302A of FIG. 3A. However, the first stage circuit 302F of FIG. 3F is different than the first stage circuit 302A of FIG. 3A in that NMOS transistor N2 is removed. Further, second stage circuit 304F of FIG. 3F is similar to the second stage circuit 304A of FIG. 3A. However, the second stage circuit 304F of FIG. 3F is different than the second stage circuit 304A of FIG. 3A in that PMOS transistor P4 of FIG. 3A is replaced with NMOS transistor N11, which is coupled between node_3 and NMOS transistor N3. Also, NMOS transistor N11 receives the feedback signal NCK (inverted clock signal). Further, the second stage circuit 304F of FIG. 3F is different than the second stage circuit 304A of FIG. 3A in that PMOS transistor P3 is coupled between node_5 and node_3 of the first stage circuit 302F. In this instance, the optional feed-forward signal x is provided to PMOS transistor P3, instead of VDD. Further, as shown in FIG. 3F, the second intermediate signal M is taken from node_3 of second stage circuit 304F and provided to node_1 of the second stage circuit 306A.

FIG. 4 illustrates a phase operational diagram 400 of the clock gating circuitry 300E of FIG. 3E in accordance with implementations described herein. As shown in FIG. 4, the phase diagram 400 includes various node values 402 and transistor states 404 for phases 1-9. As described herein above, the second stage circuits 304A, 306A, 308B are coupled together and arranged to provide a latching function.

In a first phase (phase 1), when E/SE=0 and CK=0, then NE is pulled to 1, M is pulled to 0, NM and NCK are pulled to 1, and as a result, the output signal ECK=0. In this instance, transistors N0, N1, N2, P3, N5 and P7 are OFF, and transistors P2, P1, P0, N3, P4 and N6 are ON.

In a second phase (phase 2), when E/SE=0 and CK=1, then NE floats, and there is no impact since second stage PMOS P4 is coupled to CK, which is OFF. Further, when E/SE=0 and CK=1, then M=0 and NM=1 (maintained by the latching function), NCK is pulled to 1 by the NAND circuit 310A, 312A, and as a result, the output signal ECK=0. In this instance, transistors N0, N1, N2, P2, P4 and P7 are OFF, transistors N3 and P3 are floating, and transistors P1, P0, N5 and N6 are ON. The symbols 'Z' and 'X' as shown in the phase diagram 400 of FIG. 4 refer to a floating node Z and an unknown logic state X of the transistor.

In a third phase (phase 3), when E/SE rises to 1 and CK=1, then NE is pulled to 0, M=0 and NM=1 (maintained by the latching function and isolated by CK=1), NCK is pulled to 1 by the NAND circuit 310A, 312A, and as a result, the output signal ECK=0. In this instance, transistors N2, P2, P1, P0, N3, P4 and P7 are OFF, and transistors N0, N1, P3, N5 and N6 are ON.

In a fourth phase (phase 4), when E/SE=1 and CK=0, then NE is pulled to 0, M is pulled to 1 by NE, NM is pulled to 0 by M, NCK is kept at 1 by CK, and as a result, the output signal ECK=0. In this instance, transistors P1, P0, N3, N5, N6 and P7 are OFF, and transistors N0, N1, N2, P2, P4 and P3 are ON.

In a fifth phase (phase 5), when E/SE=1 and CK rises to 1, then NE is pulled to 0 by E and M, M and NM are maintained by the latching function, NCK is pulled to 0 by CK, and as a result, the output signal ECK=CK. In this instance, transistors P2, P1, P0, N3, P4 and N6 are OFF, and transistors N0, N1, N2, P3, N5 and P7 are ON.

In a sixth phase (phase 6), when E/SE=1 and CK drops to 0, then NE is pulled to 0 by E, M and NM are maintained by the latching function, NCK is pulled to 1 by CK, and as a result, the output signal ECK=CK. In this instance, transistors P1, P0, N3, N5, N6 and P7 are OFF, and transistors N0, N1, N2, P2, P4 and P3 are ON.

In a seventh phase (phase 7), when E/SE=1 and CK rises to 1, then NE is pulled to 0 by E and M, M and NM are maintained by the latching function, NCK is pulled to 0 by CK, and as a result, the output signal ECK=CK. In this instance, transistors P2, P1, P0, N3, P4 and N6 are OFF, and transistors N0, N1, N2, P3, N5 and P7 are ON.

In an eighth phase (phase 8), when E/SE=0 and CK=1, then NE is pulled to 0 by M, M and NM are maintained by the latching function, NCK is pulled to 0 by CK, and as a result, the output signal ECK=CK. In this instance, transistors N0, N1, P2, N3, P4 and N6 are OFF, and transistors N2, P1, P0, P3, N5 and P7 are ON.

In a ninth phase (phase 9), when E/SE=0 and CK drops to 0, then NE is pulled to 1 by E and CK, M is pulled to 0, NM is pulled to 1 by M, NCK is pulled to 1 by CK and M, and as a result, the output signal ECK is pulled to 0. In this instance, transistors N0 N1, N2, P3, N5 and P7 are OFF, and transistors P2, P1, P0. N3, P4 and N6 are ON.

Figure 5A:
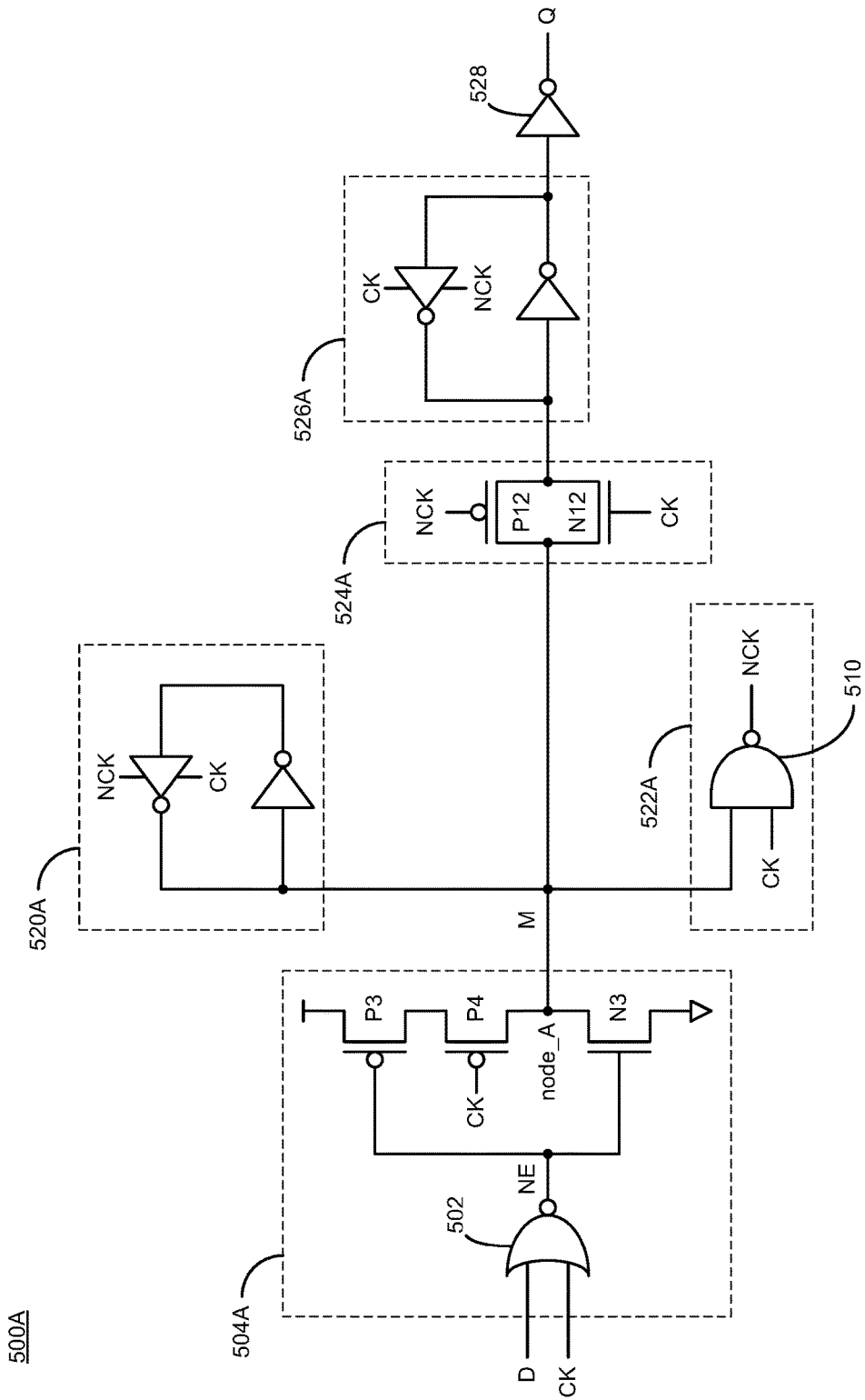
FIGS. 5A-5C illustrate various diagrams of applying the clock gating circuitry to a flip-flop in accordance with implementations described herein.
Figure 5B:
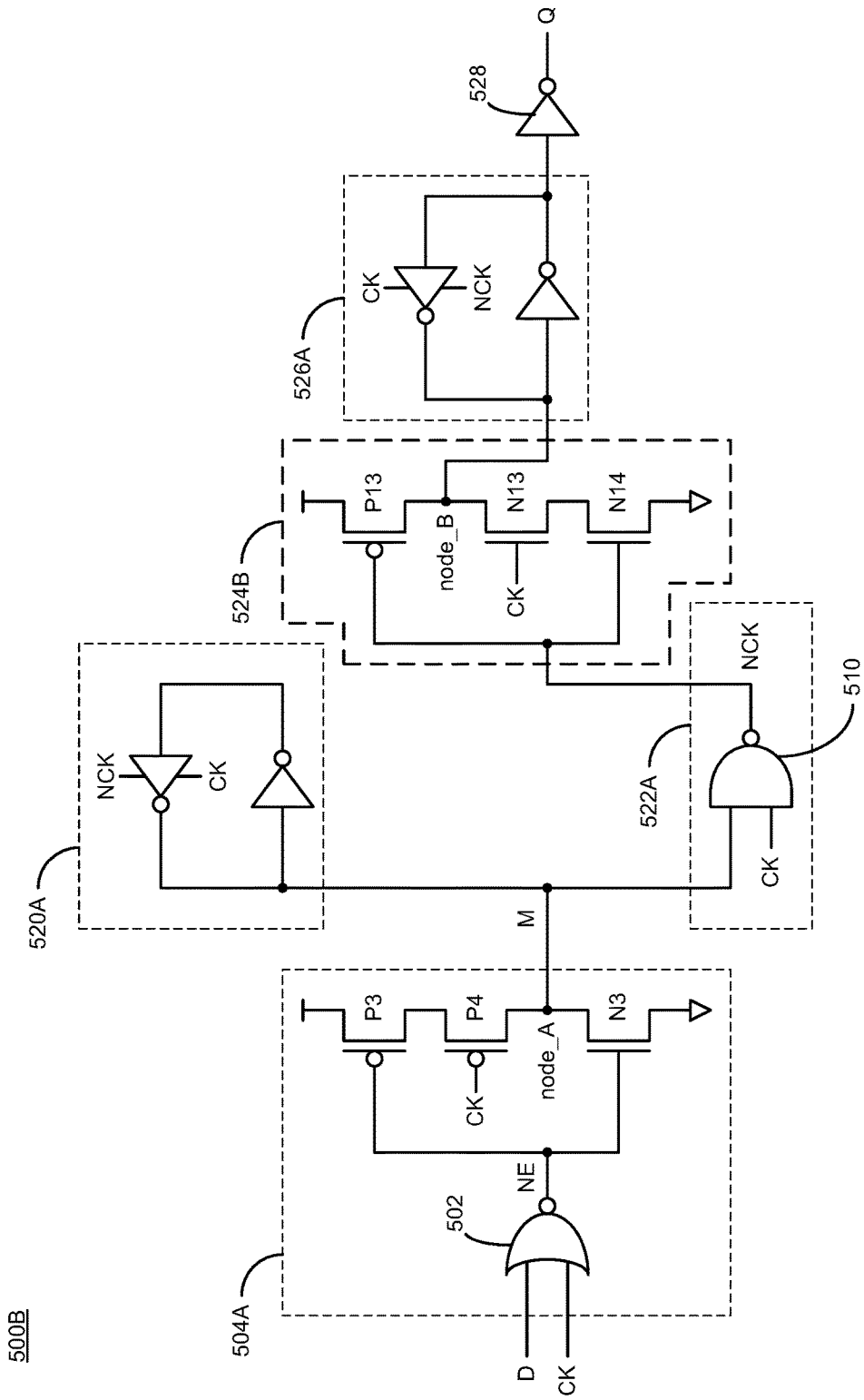
Figure 5C:
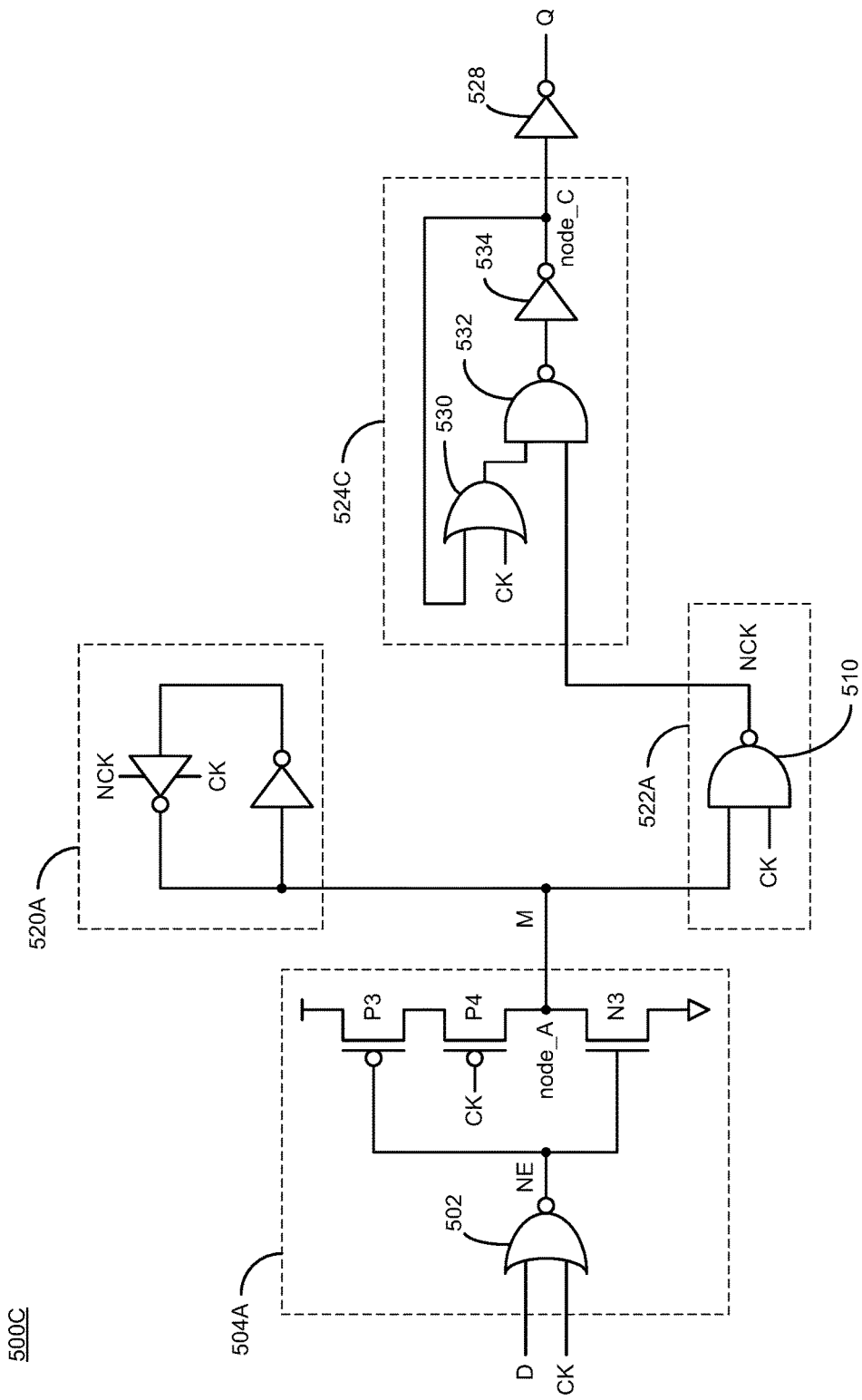

FIGS. 5A-5C illustrate various diagrams of applying the clock gating circuitry 504A to flip-flop circuitry 500A, 500B, 500C, respectively. In some implementations, each of the flip-flop circuits 500A, 500B, 500C may be embodied as a scan cell having at least one D-flip-flop (DFF), which is a positive edge (posedge) triggered storage device.

As shown in FIG. 5A, the DFF circuitry 500A may include a first circuit 504A having a NOR gate 502 that receives an input data signal D and the input clock signal CK and provides the first intermediate signal NE to PMOS transistor P3 and NMOS transistor N3 based on the input data signal D and the input clock signal CK. The input clock signal CK is also provided to PMOS transistor P4. Thus, as shown, the first circuit 504A receives the input data signal D and the input clock signal CK and provides the second intermediate signal M at node_A. The DFF circuitry 500A may include a second circuit 522A having a NAND gate 510 that receives the second intermediate signal M and the input clock signal CK and provides the inverted clock signal NCK based on the second intermediate signal M and the input clock signal CK. The DFF circuitry 500A may include another circuit 520A having back-to-back inverters arranged to maintain the second intermediate signal M based on the input clock signal CK and the inverted clock signal NCK. The DFF circuitry 500A may include another circuit 524A having PMOS transistor P12 and NMOS transistor N12 coupled together to receive and provide the second intermediate signal M based on the input clock signal CK and the inverted clock signal NCK. The DFF circuitry 500A may include another circuit 526A having back-to-back inverters arranged to further maintain the second intermediate signal M based on the input clock signal CK and the inverted clock signal NCK. The DFF circuitry 500A may include an output buffer 528 that receives the second intermediate signal M from the circuit 526A and provides an output data signal Q based on buffering the second intermediate signal M.

As shown in FIG. 5B, the DFF circuitry 500B includes circuits 504A, 520A, 522A, 526A and 528, which operate and/or function similarly as described herein above in reference to FIG. 5A. However, as shown, the NAND gate 510 of the second circuit 522A receives the second intermediate signal M and the input clock signal CK and then provides the inverted clock signal NCK to another circuit 524B based on the second intermediate signal M and the input clock signal CK.

The DFF circuitry 500B includes the circuit 524B rather than the circuit 524A. The circuit 524B has PMOS transistor P13, NMOS transistor N13 and NMOS transistor N14. The PMOS transistor P13 receives the inverted clock signal NCK from the circuit 522A, the NMOS transistor N13 receives the input clock signal CK, and the NMOS transistor N14 receives the inverted clock signal NCK from the circuit 522A, and these transistors P13, N13, N14 are arranged to provide a node_B voltage to circuit 526A via node_B.

As shown in FIG. 5C, the DFF circuitry 500C includes circuits 504A, 520A, 522A, and 528, which operate and/or function similarly as described herein above in reference to FIG. 5B. However, as shown, the NAND gate 510 of the second circuit 522A receives the second intermediate signal M and the input clock signal CK and then provides the inverted clock signal NCK to another circuit 524C based on the second intermediate signal M and the input clock signal CK.

The circuit 524C has an OR gate 530, a NAND gate 532, and an inverter 534. The OR gate 530 receives the input clock signal CK and a node_C signal from node_C, and the OR gate provides an output signal to the NAND gate 532. The NAND gate 532 receives the output signal from the NOR gate 530 and the inverted clock signal NCK from circuit 522A and provides an output signal to the inverter 534. The inverter 534 receives the output signal from the NAND gate 532 and provides an output signal to node_C and to the inverter 528.

Figure 6:
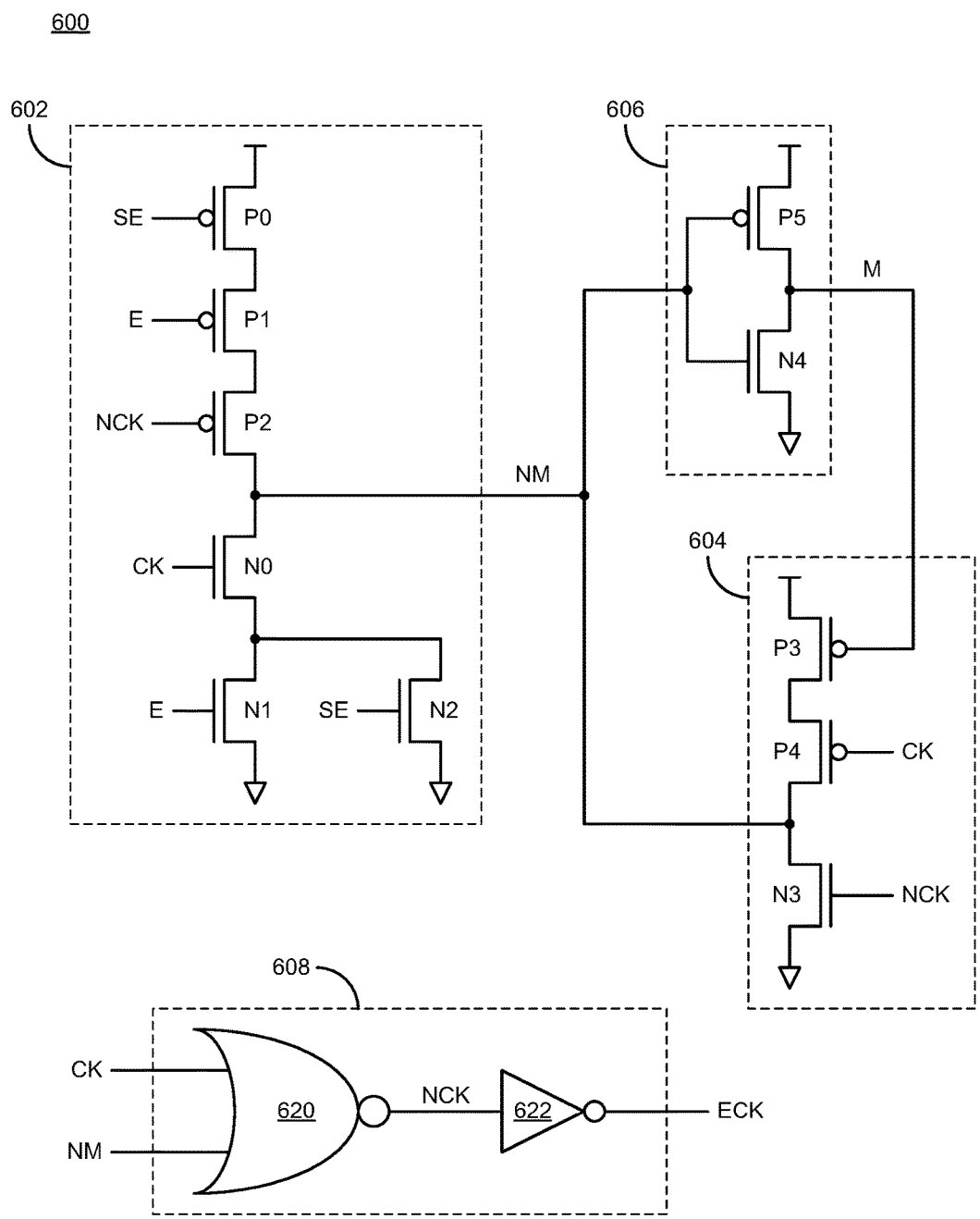
FIG. 6 illustrates a schematic diagram of clock gating circuitry in accordance with implementations described herein.

FIG. 6 illustrates a diagram of clock gating circuitry 600 in accordance with implementations described herein. As shown in FIG. 6, the clock gating circuitry 600 includes multiple stage circuits, including a first stage circuit 602, second stage circuits 604, 606, and a third stage circuit 608. FIG. 6 refers to a PREICGN application, wherein the input clock circuitry is active low or active negative.

The first stage circuit 602 of FIG. 6 has multiple transistors arranged as a multi-input (e.g., 3-input) logic structure. The multiple transistors of the first stage circuit 602 include three PMOS transistors P0, P1, P2 and three NMOS transistors N0, N1, N2. As shown, PMOS transistor P0 receives the scan enable signal SE, PMOS transistor P1 receives the enable signal E, and PMOS transistor P2 receives the inverted clock signal NCK. Further, as shown, NMOS transistor N0 receives the input clock signal CK, NMOS transistor N1 receives the enable signal E, and NMOS transistor N2 receives the scan enable signal SE. These transistors P0, P1, P2, N0, N1, N2 are disposed between the voltage source Vdd and ground Gnd, and during operation, these transistors P0, P1, P2, N0, N1, N2 are arranged to receive the input signals SE, E, NCK, CK, respectively as shown, and then provide the inverted second intermediate signal NM based on the input signals SE, E, NCK, CK, respectively as shown.

The second stage circuit 604 includes multiple transistors arranged as a ternary logic structure, and the second stage circuit 606 includes multiple transistors arranged as an inverter structure.

The multiple transistors of the second stage circuit 604 include two PMOS transistors P3, P4 and one NMOS transistor N3. As shown, PMOS transistor P3 receives the second intermediate signal M from the inverter structure 606, PMOS transistor P4 receives the clock signal CK, and NMOS transistor N3 receives the inverted clock signal NCK. These transistors P3, P4, N3 are disposed between the voltage source Vdd and ground Gnd, and during operation, these transistors P3, P4, N3 are arranged to receive the signals M, CK, NCK, respectively, and provide the inverted second intermediate signal NM based on the signals N, CK, NCK, respectively.

The multiple transistors of the second stage circuit 606 are arranged as an inverter and include one PMOS transistor P5 and one NMOS transistor N4. As shown, PMOS transistor P5 receives the inverted second intermediate signal NM and NMOS transistor N4 also receives the inverted second intermediate signal NM. These transistors P5, N4 are disposed between the voltage source Vdd and ground Gnd, and during operation, these transistors P5, N4 are arranged to receive the signal NM, respectively, and provide the second intermediate signal M based on the signal NM, respectively.

The third stage circuit 608 of FIG. 6 includes multiple logic gates, including a NOR gate 620 (e.g., NOR2 gate) and an inverter 622 that are arranged to receive signals CK, NM as inputs and then provides the output clock signal ECK. As shown, the NOR gate 620 receives the input clock signal CK and the inverted second intermediate signal NM and provides the inverted clock signal NCK, and the inverter 622 receives the inverted clock signal NCK and provides the output clock signal ECK.

Figure 7:
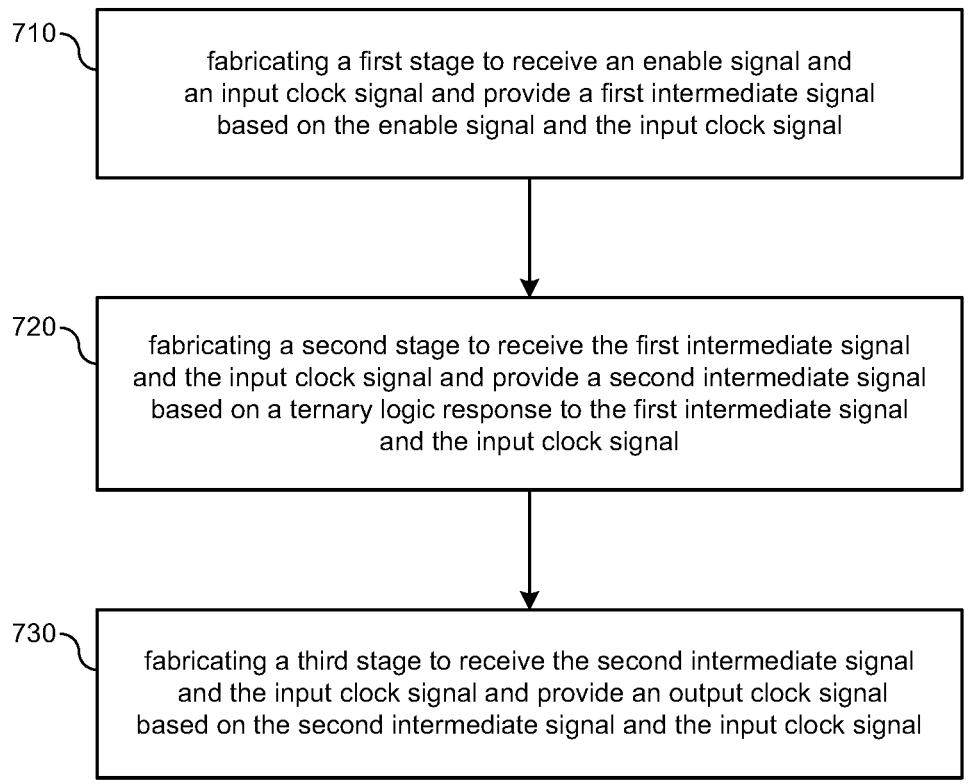
FIG. 7 illustrates a process diagram of a method for fabricating clock gating circuitry in accordance with implementations described herein.

FIG. 7 illustrates a process flow diagram of a method 700 for fabricating clock gating circuitry in accordance with implementations described herein.

It should be understood that even though method 700 may indicate a particular order of operation execution, various certain portions of the operations may be executed in a different order, and on different systems. Additional operations and/or steps may be added to and/or omitted from method 700. Method 700 may be implemented in hardware and/or software. If implemented in hardware, the method 700 may be implemented with various circuit components, such as described herein above in reference to FIGS. 1-6. If implemented in software, method 700 may be implemented as a program or software instruction process that is configured for implementing clock gating circuitry as described herein above. Further, if implemented in software, instructions related to implementing method 700 may be stored or recorded in memory. As such, a computer, a server, or any other types of computing devices having a processor and memory may be configured to perform the method 700.

In reference to the process flow diagram of FIG. 7, method 700 may be used for manufacturing and implementing clock gating circuitry. In some implementations, at block 710, method 700 may fabricate a first stage to receive an enable signal and an input clock signal and provide a first intermediate signal based on the enable signal and the input clock signal. At block 720, method 700 may fabricate a second stage to receive the first intermediate signal and the input clock signal and provide a second intermediate signal based on a ternary logic response to the first intermediate signal and the input clock signal. At block 730, method 700 may fabricate a third stage to receive the second intermediate signal and the input clock signal and provide an output clock signal based on the second intermediate signal and the input clock signal.

The first stage may include a logic function circuit having a NOR gate structure that provides the first intermediate signal based on the enable signal and the input clock signal. The second stage may include a latching function circuit for holding a data value through use of the ternary logic response to the first intermediate signal and the input clock signal. The latching function circuit may have a ternary logic structure that provides the ternary logic response to the first intermediate signal and the input clock signal. The ternary logic structure of the second stage may include less than four transistors arranged to receive the first intermediate signal and the input clock signal and provide the second intermediate signal based on the ternary logic response to the first intermediate signal and the input clock signal. The less than four transistors of the ternary logic structure of the second stage may include CMOS transistors including two PMOS transistors and one NMOS transistor.

Further, the third stage may include a logic function circuit having a NAND gate structure and an inverter gate structure arranged to provide the output clock signal based on the second intermediate signal and the input clock signal. The third stage may include an integrated clock gating (ICG) circuit that interrupts the input clock signal to a logical off state in response to the second intermediate signal and the input clock signal. The third stage may provide a feedback signal to the second stage, and in this instance, the second stage may receive the feedback signal and may provide the second intermediate signal based on the ternary logic response to the first intermediate signal, the input clock signal and the feedback signal. The feedback signal may be an inverted clock signal. The third stage may include a NAND gate structure that receives the second intermediate signal and the input clock signal and provides the feedback signal based on the second intermediate signal and the input clock signal. The third stage may include an inverter gate structure coupled to the NAND gate structure, and the inverter gate structure may receive the feedback signal from the NAND gate structure and may provide the output clock signal based on the feedback signal.

Described herein are various implementations of an integrated circuit. The integrated circuit may include a first stage that receives an enable signal and an input clock signal and provides a first intermediate signal based on the enable signal and the input clock signal. The integrated circuit may include a second stage that receives the first intermediate signal and the input clock signal and provides a second intermediate signal based on a ternary logic response to the first intermediate signal and the input clock signal. The integrated circuit may include a third stage that receives the second intermediate signal and the input clock signal and provides an output clock signal based on the second intermediate signal and the input clock signal.

Described herein are various implementations of an integrated circuit. The integrated circuit may include logic function circuitry that provides a first intermediate signal based on receiving an enable signal and an input clock signal. The integrated circuit may include latching function circuitry that receives the first intermediate signal and the input clock signal and provides a second intermediate signal based on a ternary logic response to the first intermediate signal and the input clock signal. The integrated circuit may include integrated clock gating circuitry that receives the second intermediate signal and the input clock signal, interrupts the input clock signal to a logical off state, and provides an output clock signal in response to receiving the second intermediate signal and the input clock signal.

Described herein are various implementations of a method for manufacturing an integrated circuit. The method may include fabricating a first stage to receive an enable signal and an input clock signal and provide a first intermediate signal based on the enable signal and the input clock signal. The method may include fabricating a second stage to receive the first intermediate signal and the input clock signal and provide a second intermediate signal based on a ternary logic response to the first intermediate signal and the input clock signal. The method may include fabricating a third stage to receive the second intermediate signal and the input clock signal and provide an output clock signal based on the second intermediate signal and the input clock signal.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   a first stage that receives an enable signal and provides a first intermediate signal based on the enable signal;
   a second stage that receives the first intermediate signal, an input clock signal, and an inverted input clock signal and provides a second intermediate signal based on a ternary logic response to the first intermediate signal, the input clock signal, and the inverted input clock signal; and
   a third stage that receives the second intermediate signal and the input clock signal and provides an output clock signal based on the second intermediate signal and the input clock signal.

2. The integrated circuit of claim 1, wherein the first stage comprises a logic function circuit having a NOR gate structure that provides the first intermediate signal based on the enable signal and the input clock signal.

3. The integrated circuit of claim 1, wherein the second stage comprises a latching function circuit for holding a data value through use of the ternary logic response to the first intermediate signal and the input clock signal.

4. The integrated circuit of claim 1, wherein the second stage comprises a latching function circuit having a ternary logic structure that provides the ternary logic response to the first intermediate signal and the input clock signal.

5. The integrated circuit of claim 4, wherein the ternary logic structure of the second stage comprises less than four transistors arranged to receive the first intermediate signal and the input clock signal and provide the second intermediate signal based on the ternary logic response to the first intermediate signal and the input clock signal.

6. The integrated circuit of claim 5, wherein the less than four transistors of the ternary logic structure of the second stage comprises complementary metal-oxide-semiconductor (CMOS) transistors including two P-type MOS (PMOS) transistors and one N-type MOS (NMOS) transistor.

7. The integrated circuit of claim 1, wherein the third stage comprises a logic function circuit having a NAND gate structure and an inverter gate structure arranged to provide the output clock signal based on the second intermediate signal and the input clock signal.

8. The integrated circuit of claim 1, wherein the third stage comprises an integrated clock gating circuit that interrupts the input clock signal to a logical off state in response to the second intermediate signal and the input clock signal.

9. The integrated circuit of claim 1, wherein the third stage provides a feedback signal to the second stage, and wherein the second stage receives the feedback signal and provides the second intermediate signal based on the ternary logic response to the first intermediate signal, the input clock signal and the feedback signal.

10. The integrated circuit of claim 9, wherein the feedback signal comprises an inverted clock signal.

11. The integrated circuit of claim 9, wherein the third stage comprises:
a NAND gate structure that receives the second intermediate signal and the input clock signal and provides the feedback signal based on the second intermediate signal and the input clock signal; and
an inverter gate structure coupled to the NAND gate structure, wherein the inverter gate structure receives the feedback signal from the NAND gate structure and provides the output clock signal based on the feedback signal.

12. An integrated circuit, comprising:
logic function circuitry that provides a first intermediate signal based on receiving an enable signal;
latching function circuitry that receives the first intermediate signal, an input clock signal, and an inverted input clock signal and provides a second intermediate signal based on a ternary logic response to the first intermediate signal, the input clock signal, and the inverted input clock signal; and
integrated clock gating circuitry that receives the second intermediate signal and the input clock signal, interrupts the input clock signal to a logical off state, and provides an output clock signal in response to receiving the second intermediate signal and the input clock signal.

13. The integrated circuit of claim 12, wherein the logic function circuitry comprises a NOR gate structure that provides the first intermediate signal based on the enable signal and the input clock signal.

14. The integrated circuit of claim 12, wherein the latching function circuitry holds a data value through use of the ternary logic response to the first intermediate signal and the input clock signal.

15. The integrated circuit of claim 12, wherein the latching function circuitry comprises less than four transistors arranged to receive the first intermediate signal and the input clock signal and provide the second intermediate signal based on the ternary logic response to the first intermediate signal and the input clock signal.

16. The integrated circuit of claim 12, wherein the integrated clock gating circuitry comprises a NAND gate structure and an inverter gate structure arranged to provide the output clock signal based on the second intermediate signal and the input clock signal.

17. The integrated circuit of claim 12, wherein the integrated clock gating circuitry further provides a feedback signal to the latching function circuitry, and wherein the latching function circuitry receives the feedback signal and provides the second intermediate signal based on the ternary logic response to the first intermediate signal, the input clock signal and the feedback signal.

18. The integrated circuit of claim 17, wherein the feedback signal comprises an inverted clock signal.

19. The integrated circuit of claim 17, wherein the integrated clock gating circuitry comprises:
a NAND gate structure that receives the second intermediate signal and the input clock signal and provides the feedback signal based on the second intermediate signal and the input clock signal; and
an inverter gate structure coupled to the NAND gate structure, wherein the inverter gate structure receives the feedback signal from the NAND gate structure and provides the output clock signal based on the feedback signal.

20. A method for manufacturing an integrated circuit, the method comprising:
fabricating a first stage to receive an enable signal and to provide a first intermediate signal based on the enable signal;
fabricating a second stage to receive the first intermediate signal, an input clock signal, and an inverted input clock signal and to provide a second intermediate signal based on a ternary logic response to the first intermediate signal, the input clock signal, and the inverted input clock signal; and
fabricating a third stage to receive the second intermediate signal and the input clock signal and provide an output clock signal based on the second intermediate signal and the input clock signal.

21. The integrated circuit of claim 3, wherein the latching function circuit for holding the data value is additionally responsive to the inverted input clock signal and wherein a first ternary circuit establishes the first intermediate signal, wherein a second ternary circuit provides a portion of the latching function, and wherein an output of the second ternary circuit is shared with an output signal from the first ternary circuit.

22. The integrated circuit of claim 4, wherein the latching function circuit for holding a data value through use of the ternary logic is additionally in response to the inverted clock signal, wherein the latching function circuit comprises a first ternary circuit and a second ternary circuit.

23. The integrated circuit of claim 1, wherein the second intermediate signal provided by the second stage comprises a latched signal.

* * * * *